July 30, 1963 J. MATTERN 3,099,802
D.C. COUPLED AMPLIFIER USING COMPLEMENTARY TRANSISTORS
Filed Dec. 7, 1959
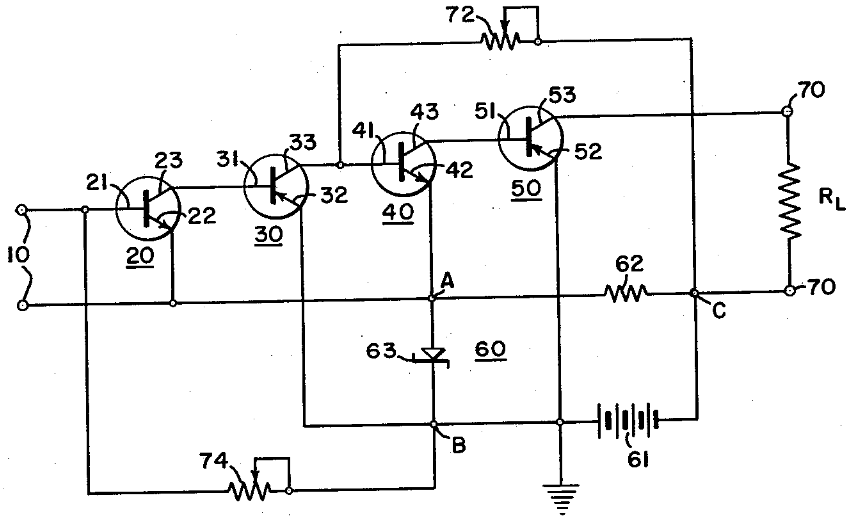
WITNESSES
John C. Healey, Jr.
James F. Young
INVENTOR
John Mattern
BY V. W. Cleary
ATTORNEY United States Patent Office 3,099,802 Patented July 30, 1963

3,099,802

D.C. COUPLED AMPLIFIER USING COMPLEMENTARY TRANSISTORS

John Mattern, Baltimore, Md., assignor to Westinghouse Electric Corporation, East Pittsburgh, Pa., a corporation of Pennsylvania Filed Dec. 7, 1959, Ser. No. 857,895
1 Claim. (Cl. 330—17)

This invention relates in general to direct coupled amplifiers and more specifically to direct coupled amplifier circuit utilizing semiconductor devices such as transistors.

It is an object of the invention to provide an improved and efficient direct coupled amplifier circuit utilizing semiconductor devices such as transistors.

It is another object of the invention to provide a direct coupled amplifier utilizing transistors, and having a relatively high gain.

Still another object of the invention is to provide a direct coupled amplifier utilizing transistors and having only one source of direct current voltage.

A further object of the invention is the provision for an improved direct current amplifier circuit which is simple in construction yet effects a relatively high gain from an input signal being applied thereto.

A further object of the invention is to provide a direct coupled amplifier which efficiently utilizes transistors or semiconductor devices having a minimum of connections and only one direct current voltage source.

The invention itself as well as additional objects and advantages thereof, will best be understood from the following description when read in connection with the accompanying drawing, in which:

The single FIGURE is a schematic circuit diagram of a transistor direct coupled amplifier circuit embodying the invention.

The embodiment of the invention illustrated in the drawing consists generally of a direct coupled amplifier having four stages of amplification and illustrated by the numerals 20, 30, 40 and 50. The output of each of the first three stages 20, 30 and 40 is applied between base and emitter of the next succeeding stage through a direct current voltage source 60. The single direct current voltage source 60 provides the collector voltage to the first three stages through two points of reference potential A and B. The direct current voltage source 60 also includes a third and higher point of reference potential C to provide a higher collector voltage for the output of the last stage 50. The first and third transistors 20 and 40 are of the same conductivity type whereas the second and fourth transistors 30 and 50 are of an opposite conductivity type. The emitters of the first and third transistors 20 and 40 are connected to the first point of reference potential A whereas the emitters of the transistors 30 and 50 are connected to the second point of reference potential B so as to provide the proper polarity for the collector voltages in the respective stages. In so doing, a single voltage source is utilized to provide the collector voltage for the multistage direct coupled amplifier.

More specifically, the embodiment of the invention illustrated in the drawings comprises a pair of input terminals 10 which are connected to the base 21 and emitter 22 of transistor 20. The collector 23 of the transistor 20, is connected to the base 31 of a second transistor 30. The collector 33 of the second transistor 30 is in turn connected to the base 41 of the third transistor 40. The collector 43 of the third transistor 40 is in turn connected to the base 51 of a fourth transistor 50.

A source of direct current voltage supply 60 is employed to provide the collector voltage to the transistors 20, 30, 40 and 50. The voltage supply 60 supplies a relatively low collector voltage to the transistor 20, 30, and 40 and a relatively high collector voltage to the transistor 50. The direct current voltage source 60 comprises a direct current voltage supply 61 which is connected in series relationship with a resistor 62 and a Zener diode or a breakdown type device 63. The Zener diode 63 is biased rearwardly so that it is normally broken down and conducting in its avalanche region so as to provide a constant voltage potential across the diode to supply the proper collector voltage to the transistors 20, 30 and 40. The resistor 62 is chosen as to supply more current to the Zener diode than is drawn by the load in parallel with it. When the device illustrated in the drawing was constructed and tested, the Zener diode was a 3Z6.8. The resistor 62 was 330 ohms, and the direct current supply 61 was a direct current supply of 16 volts so that the voltage across the Zener diode 63 was a constant 6 volts. The direct current voltage source 60 includes a first, second and third point of reference potentials A, B and C respectively. The positive side of the direct current supply 61 was grounded so that the voltage between points A and B was 6 volts and the voltage between points C and ground was 16 volts.

In order to supply the 6 volts to the collector of the first three transistors, the emitters 22 and 42 of the n-p-n transistors 20 and 40 are connected to the first point of reference potential A whereas the emitters of the p-n-p transistors 30 and 50 were connected to the second point of reference potential B. As can be seen from the drawing, the collector 23 of transistor 20 was connected to the second point of reference potential B through the base and emitter 31 and 32 of transistor 30 whereas the collector 43 of transistor 40 is connected to the second point of reference potential B through the base and emitter 51 and 52 of transistor 50. Likewise, the collector of the p-n-p transistor 30 is connected to the first point of reference potential A through the base and emitter 41 and 42 of the third transistor 40. By these connections the top of polarity for the first three transistor collector voltages is supplied by the single source of direct current voltage through the first and second points of reference potential A and B.

Output terminals 70 are employed which are connected to the collector 53 of the fourth transistor 50 and the other of the pair of output terminals is connected to the third point of reference potential C. The output load of the device would be connected across the output terminal 70. For supplying a relatively high collector voltage to the transistor 50, the third point of reference potential C is connected to the collector 53 through the load resistance $R_L$ and the output terminals 70. As stated above in the test made on the device illustrated in the drawing, the third point of reference potential C supplied 16 volts to the collector with the emitter 52 being grounded.

Hence, it is seen that all four stages are grounded emitter type amplifiers to provide a maximum gain for the device. All the collector voltages are supplied to the four stages of amplification by the single direct current voltage supply 60 which employs three points of reference potential A, B, and C to properly proportion the collector voltage to the stages.

A variable resistor 74 is connected between a second point of reference potential B and the base 21 of the first transistor 20. This variable resistor 74 can be employed to adjust the reference current or bias of the device. Another variable resistor 72 is connected between the third point of reference potential C and the base 41 of the third transistor 40. This variable resistor 72 can be varied to adjust or compensate for the amplified leakage current in the device.

While I have described above the principles of my invention in connection with the specific apparatus it is clearly understood that this description is made only by way of example and not as a limitation of the scope of my invention as set forth in the objects.

I claim as my invention:

A direct coupled amplifier comprising: an input means; a first semiconductor device of one conductivity type operably connected to said input means and having a first base, a first emitter and a first collector electrode; a second semiconductor device of an opposite conductivity type having a second base, a second emitter and a second collector electrode; a third semiconductor device of said one conductivity type having a third base, a third emitter and a third collector electrode; a fourth semiconductor device of said opposite conductivity type having a fourth base, a fourth emitter and a fourth collector electrode; circuit means for applying a direct current voltage; a series combination of a resistance means and a Zener diode connected across said circuit means for providing a first point of reference potential at the common junction between said resistance means and said Zener diode, a second point of reference potential at the opposite side of said Zener diode, and a third point of reference potential at the opposite side of said resistance means; said first collector electrode being connected to said second base electrode, said second collector electrode being connected to said third base electrode, said third collector electrode being connected to said fourth base electrode, said first and said third emitter electrodes being connected to said first point of reference potential, said second and said fourth emitter electrode being connected to said second of reference potential; output means including a first output terminal connected to said fourth collector electrode and a second output terminal connected to said third point of reference potnetial; a variable resistance connected between said third point of reference potential and said third base electrode; and another variable resistance connected between said second point of reference potential and said first base electrode.

References Cited in the file of this patent

UNITED STATES PATENTS

| | | |
|---|---|---|
| 2,714,702 | Schockley | Aug. 2, 1955 |
| 2,828,450 | Pinckaers | Mar. 25, 1958 |
| 2,966,632 | Sziklai | Dec. 27, 1960 |
| 3,007,102 | Kennedy | Oct. 31, 1961 |
| 3,008,091 | Van Overbeek et al. | Nov. 7, 1961 |

FOREIGN PATENTS

| | | |
|---|---|---|
| 523,250 | Belgium | Apr. 3, 1954 |

OTHER REFERENCES

Shea: "Principles of Transistor Circuitry," Sept. 15, 1953, pages 177–179.